United States Patent [19]

Tateyama et al.

[11] Patent Number: 5,252,137

[45] Date of Patent: Oct. 12, 1993

[54] SYSTEM AND METHOD FOR APPLYING A LIQUID

[75] Inventors: Kiyohisa Tateyama, Kumamoto; Keizo Hasebe, Kofu, both of Japan

[73] Assignees: Tokyo Electron Limited, Tokyo; Electron Kyushu Limited, Kumamoto; Kabushiki Kaisha Toshiba, Kawasaki, all of Japan

[21] Appl. No.: 758,128

[22] Filed: Sep. 12, 1991

[30] Foreign Application Priority Data

Sep. 14, 1990 [JP] Japan .................. 2-245607

[51] Int. Cl.⁵ .............................. B08B 3/00
[52] U.S. Cl. ........................ 134/34; 134/24; 134/42; 134/169 R; 134/171; 134/175
[58] Field of Search .............. 134/8, 15, 22-18, 134/23, 24, 34, 168 R, 169 R, 171

[56] References Cited

U.S. PATENT DOCUMENTS

| | | | |
|---|---|---|---|
| 4,579,597 | 4/1986 | Sasa et al. | 134/24 |
| 5,002,008 | 3/1991 | Ushijima et al. | 118/302 |
| 5,009,715 | 4/1991 | Wilson | 134/34 |
| 5,013,530 | 5/1991 | McGregor | 134/22.18 |

FOREIGN PATENT DOCUMENTS 57-52132  3/1982  Japan .
57-192955  11/1982  Japan .

*Primary Examiner*—Anthony McFarlane
*Attorney, Agent, or Firm*—Oblon, Spivak, McClelland, Maier & Neustadt

[57] ABSTRACT

A liquid applying system according to the present invention comprises a liquid supply source and a nozzle communicating with the liquid supply source. The nozzle comprises a liquid storing portion for storing a liquid supplied from the liquid supply source, a number of small passages communicating with the liquid storing portion, each of the small passages having a transverse section which is smaller than that of the liquid storing portion, and a slit-like passage communicating with the small passages, in which liquids from the small passages flow together and from which the liquids are continuously discharged like a curtain toward a semiconductor wafer.

14 Claims, 6 Drawing Sheets

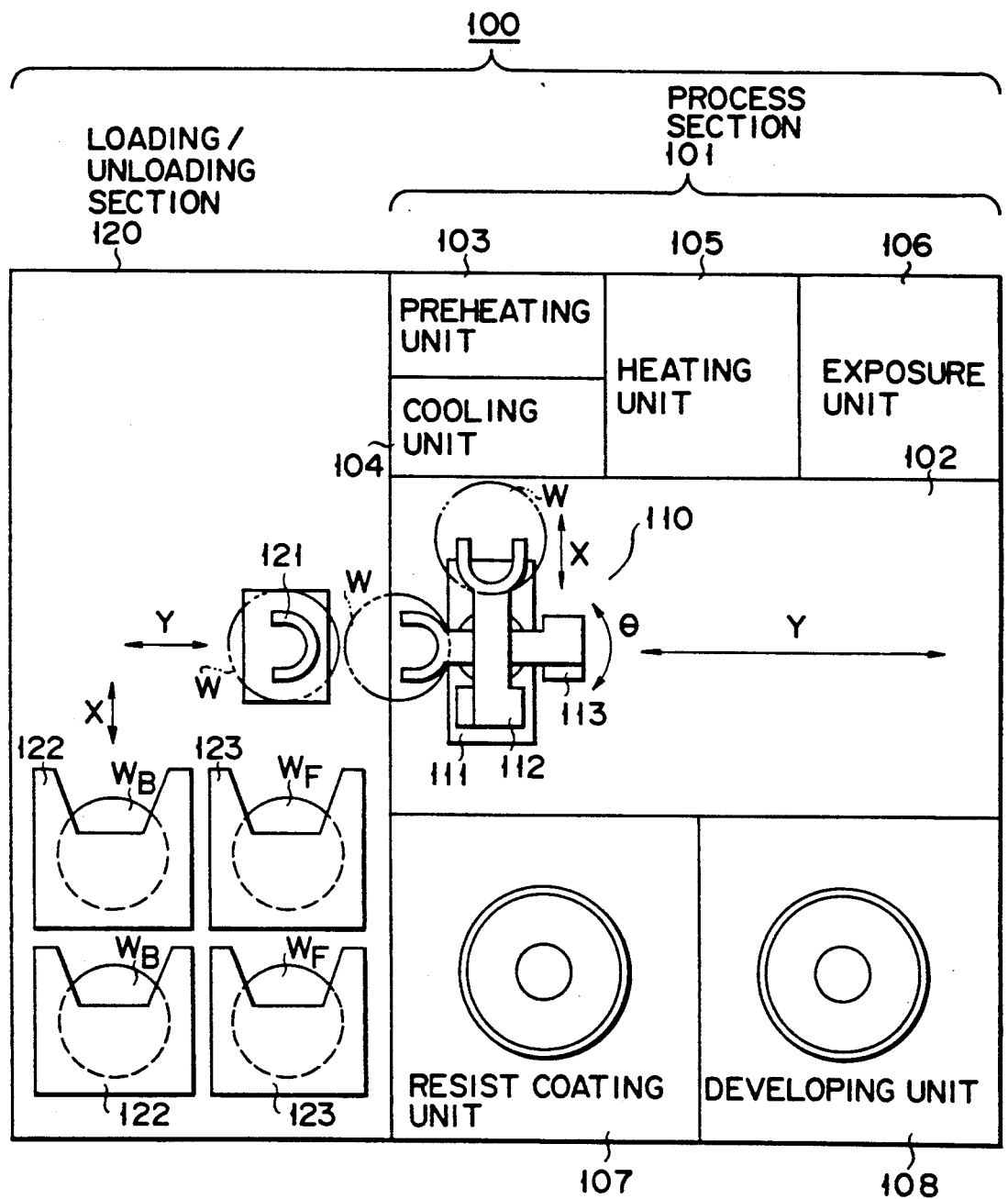
F I G. 1

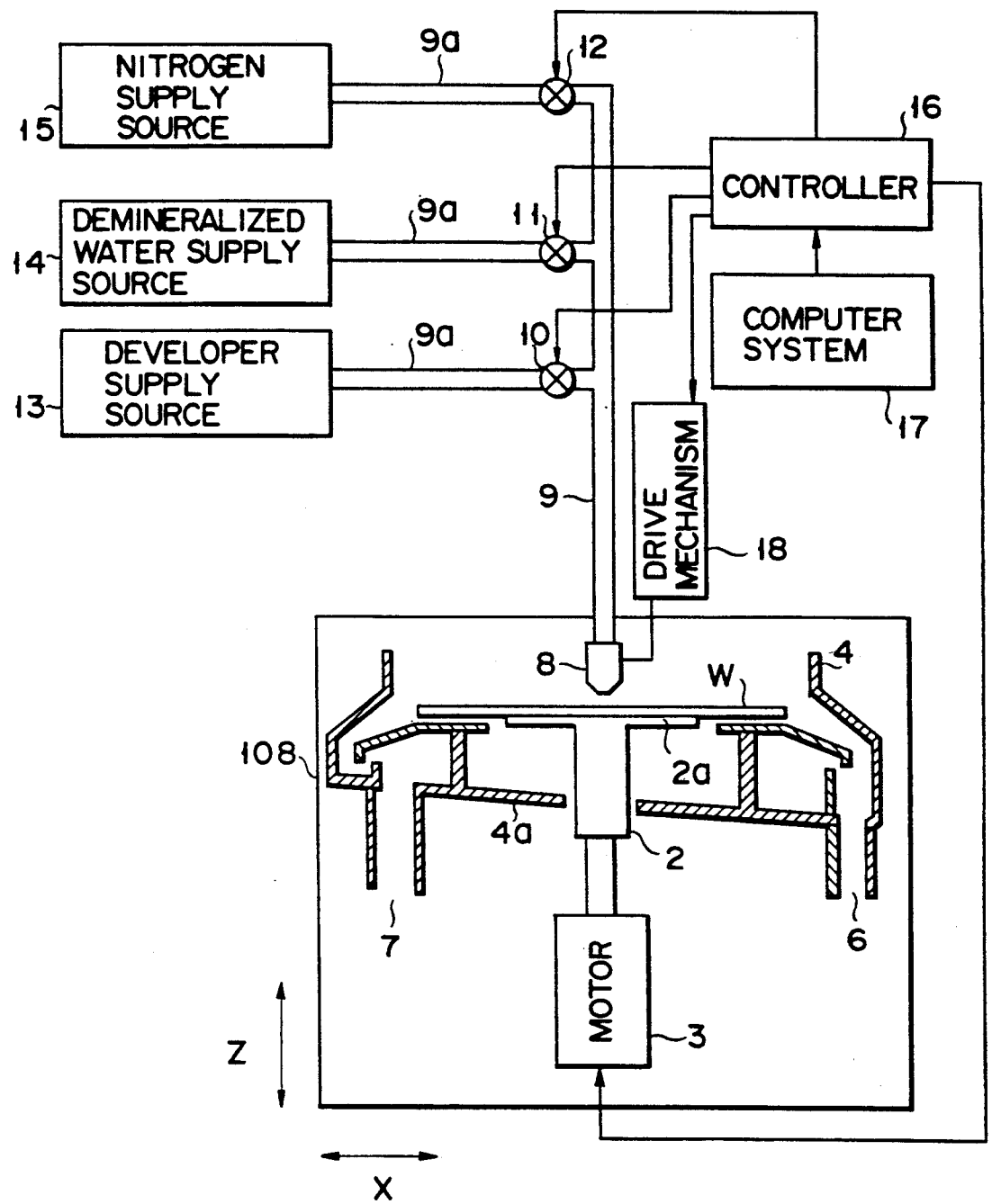
F I G. 2

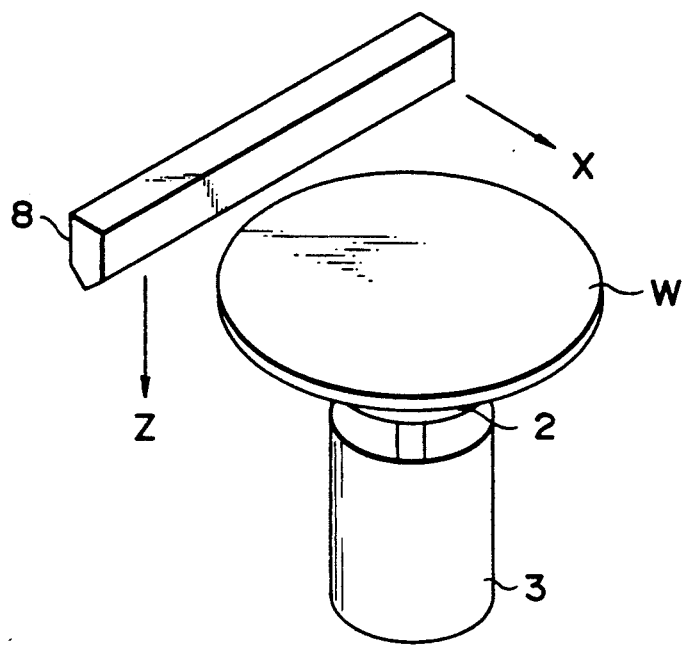
F I G. 3
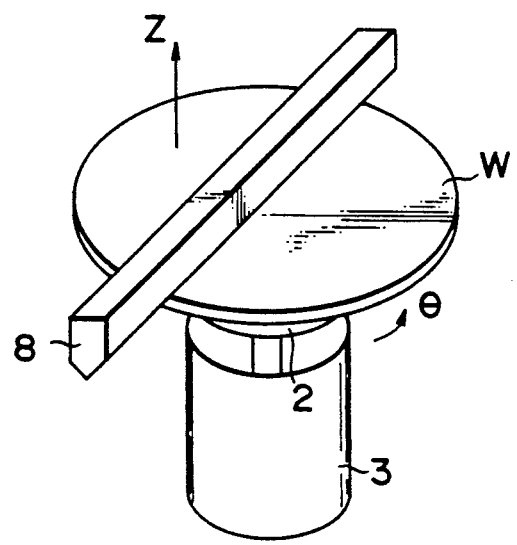
F I G. 4

SYSTEM AND METHOD FOR APPLYING A LIQUID

BACKGROUND OF THE INVENTION

1. Field of the Invention

The present invention relates to a system and a method for applying a liquid and, more particularly, to a low-conductance band-like nozzle for applying a liquid such as a developer to an object to be processed, such as a semiconductor wafer.

2. Description of the Related Art

In the developing step of the process of manufacturing a semiconductor device, a developer needs to be uniformly applied to a resist film on a semiconductor wafer within a predetermined period of time. The reason is as follows. The developing uniformity of the resist film generally depends upon the developing state thereof. If the developer is not applied to the entire surface of the semiconductor wafer in the beginning, developing nonuniformity occurs. Various types of nozzles for applying a liquid have conventionally been proposed to prevent the developing nonuniformity.

Published Unexamined Japanese Patent Application No. 57-52132 discloses a nozzle having a plurality of discharge openings from which a developer is supplied in a showery manner. If, however, the developer is supplied from the nozzle in the showery manner, a number of bubbles are generated on the surface of the wafer, and time is insufficient for development by several seconds during which the bubbles exist on the wafer, resulting in decrease in developing uniformity.

Published Unexamined Japanese Patent Application No. 57-192955 discloses a nozzle having a slit-like discharge opening from which a developer is supplied like a curtain. In this nozzle, however, the pressure of a liquid storing portion is not uniformed, and an amount of liquid discharged from the slit-like discharge opening, which is located near an inlet for supplying the developer to the liquid storing portion is made larger than that of liquid discharged from the other opening, resulting in decrease in developing uniformity.

SUMMARY OF THE INVENTION

It is accordingly an object of the present invention to provide a system and a method for applying a liquid, the system having a nozzle capable of uniformly supplying the liquid while preventing bubbles from being generated.

According to an aspect of the present invention, there is provided a system for applying a liquid, comprising a liquid supply source, and a nozzle communicating with the liquid supply source. The nozzle includes a liquid storing portion for storing a liquid supplied from the liquid supply source, a number of small passages communicating with the liquid storing portion, each of the small passages having a transverse section which is smaller than that of the liquid storing portion, and a slit-like passage communicating with the thin tubes, in which liquids from the thin tubes flow together and from which the liquids are discharged toward the object to be processed.

According to another aspect of the present invention, there is provided a method for applying a liquid to an object to be processed, comprising the steps of: (a) preparing the object to be processed; (b) preparing nozzle means, the nozzle means including: a liquid storing portion communicating with a liquid supply source, for storing a liquid supplied from a liquid supply source; a number of small passages communicating with the liquid storing portion, each of the small passages having a transverse section which is smaller than that of the liquid storing portion; and a slit-like passage communicating with the small passages, in which liquids from the small passages flow together and from which the liquids are discharged toward the object to be processed; (c) causing an opening of the slit-like passage of the nozzle means to face the object to be processed; (d) discharging the liquids from the nozzle means to the object to be processed while relatively moving the nozzle means and the object to be processed; and (e) separating the nozzle means from the object to be processed.

Conductance C used as an index representing an ability of liquid to flow, is given by the following equation:

$$C = Q/\Delta P$$

where Q is a flow rate of the liquid passing through a small passage, and $\Delta P$ is a difference in pressure between inlets and outlets of the small passage.

Since the transverse section of each thin tube is smaller than that of the liquid storing portion and the ratio of the length of each small passage to the cross section thereof is large, the conductance C of the small passage is decreased. In other words, since a flow resistance is abruptly increased in the small passage, the liquid is uniformly supplied from the liquid storing portion to the small passage. When the liquids flow from the small passages to the slit-like passage, they flow together in the slit-like passage and continuously discharged therefrom like a curtain.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view schematically showing a resist process device having a number of process units;

FIG. 2 is a block diagram schematically showing a liquid applying system according to an embodiment of the present invention;

FIGS. 3 and 4 are perspective views showing a the relationship in position between a nozzle and a semiconductor wafer;

DETAILED DESCRIPTION OF THE PREFERRED EMBODIMENTS

Figure 5:
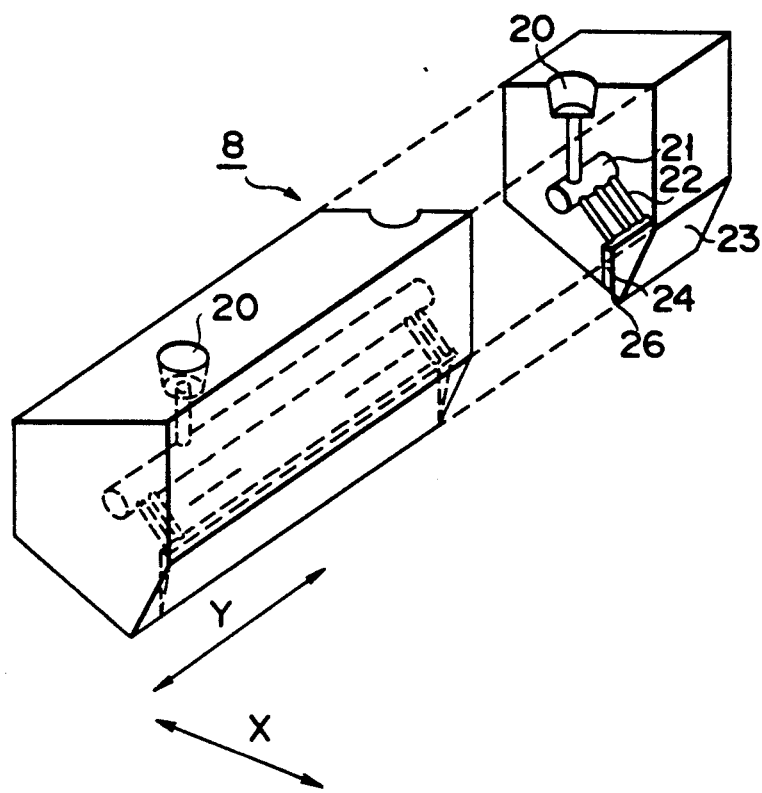
FIG. 5 is a partly broken cross-sectional perspective view of the nozzle according to the embodiment of the present invention.

Embodiments of the present invention will be described with reference to the accompanying drawings.

As shown in FIG. 1, a resist process apparatus 100 includes a process section 101 and a loading/unloading section 120. The process section 101 is provided with a number of process units 103 to 108 and a middle passage 102. Of these process units, a preheating unit 103, a cooling unit 104, a heating unit 105, and an exposure unit 106 are arranged on one side of the middle passage 102, and a resist coating unit 107 and a developing unit 108 are arranged on the other side of the middle passage 102.

The middle passage 102 is provided with a carrying robot 110. The carrying robot 110 includes a carriage 111 to move along the passage 102 (in the direction of Y-axis). The carrying robot 110 also includes paired handling mechanisms 112 and 113 for handling a wafer, for example, supporting two wafers, to put/remove a semiconductor wafer W in/from each of the process units. The handling mechanisms 112 and 113 move in the directions of X- and Y-axes and in the direction of Z-axis (not shown but corresponding to the vertical direction), and rotates through an angle of θ.

The loading/unloading section 120 includes a loading/unloading station 121 and a cassette station. The cassette station has a plurality of wafer cassettes 122 and 123 for housing processed wafers $W_B$ and unprocessed wafers $W_F$. These wafer cassettes 122 and 123 are carried by a robot (not shown) to the cassette station from outside. Further, the wafer cassettes housing the processed cassettes $W_B$ are unloaded from the cassette station by the robot.

The loading/unloading station 121 includes a mechanism for taking out the wafer W from the wafer cassettes, a mechanism for carrying the wafer W to a table, a mechanism for placing the wafer W on the table, a mechanism for centering the wafer W, and a mechanism for adjusting the height of the table. The wafer W is positioned by the loading/unloading station 121 and then carried by the carrying robot 110 from the loading/unloading section 120 to the process section 101. Each of the above mechanisms is automatically controlled by a computer system to which a predetermined program is input.

The developing unit 108 of FIG. 1 included in the process section 101 will be described with reference to FIG. 2.

The developing unit 108 includes a spin chuck 2 surrounded by cup 4. The spin chuck 2 is connected at its bottom to a drive shaft of an AC servo motor 3, and faces a nozzle 8 at its top. The top portion 2a of the spin chuck 2 is shaped like a disk and made of fluororesin. A passage (not shown), which communicates with a vacuum pump (not shown), reaches the upper surface of a disk 2a of the spin chuck 2. In other words, the wafer W is fixed onto the upper surface of the disk 2a by vacuum attraction.

An output section of a controller 16 is connected to a power switch of the motor 3 to start/stop the motor 3 and to control the rotational speed thereof. The controller 16 is backed up by a computer system 17. A predetermined recipe is input to the computer system 17.

A bottom portion 4a of the cup 4 is formed so that the waste liquid collects. The bottom portion 4a is inclined to a drain 6 to externally drain the waste liquid through the drain 6. The bottom portion 4a is inclined toward a vent 7 to externally exhaust waste gas through the vent 7.

One end of a supply tube 9 is connected to the nozzle 8. The other end of the supply tube 9 is branched into three tubes 9a. Each of the branched tubes 9a communicates with a developer supply source 13, a demineralized water supply source 14, and a nitrogen supply source 15 via first, second and third valves 10, 11 and 12. Power switches for opening/closing the valve plugs of the first, second and third valves 10, 11 and 12 are connected to the output of the controller 16.

A drive mechanism 18 is attached to the nozzle 8, and a motor power switch of the drive mechanism is connected to the output section of the controller 16. The drive mechanism 18 comprises a dual ball screw, a linear guide, and a stepping motor (which are not shown). As shown in FIGS. 3 and 4, the drive mechanism 18 moves the nozzle 8 in the horizontal direction (in the direction of X-axis) and in the vertical direction (in the direction of Z-axis).

The nozzle 8 will be described in detail with reference to FIGS. 5 to 7.

Figure 6:
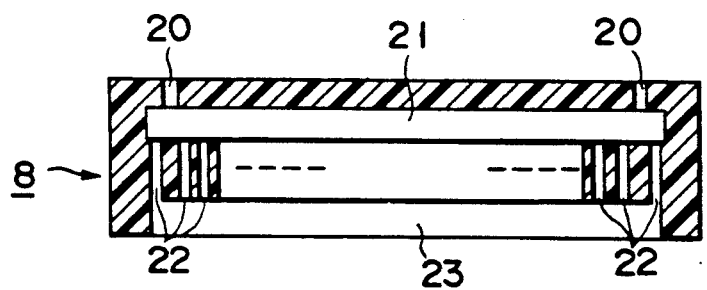
FIG. 6 is a transverse sectional view showing the nozzle according to the embodiment of the present invention.

As shown in FIGS. 5 and 6, the nozzle 8 has two inlets 20 at its top and a discharge portion 23 at its bottom, and extends in the horizontal direction (in the direction of Y-axis). A liquid storing portion 21 and a number of small passages 22 are formed between the inlets 20 and the discharge portion 23. The inner walls of the small passages 22 are made of hard vinyl chloride or fluororesin. The small passages 22 are arranged in a row along the liquid storing portion 21 at predetermined intervals of, e.g., 0.3 to 2.0 mm.

Figure 7:
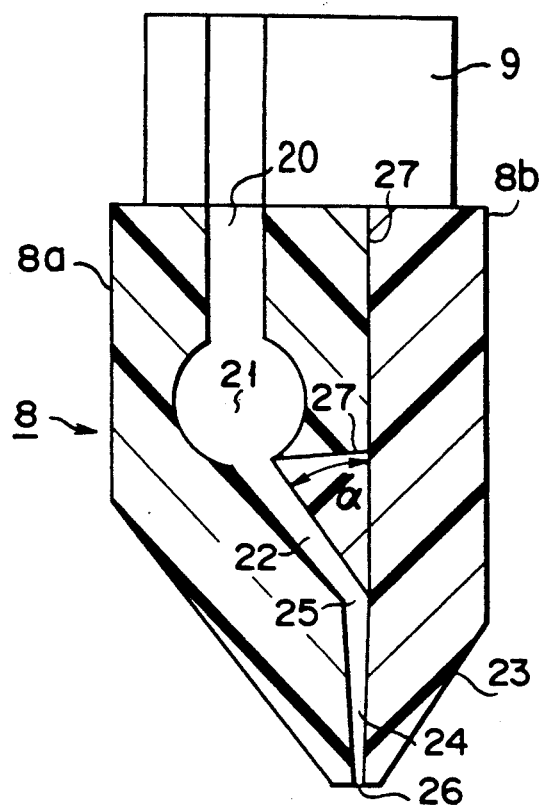
FIG. 7 is a vertical sectional view showing the nozzle according to the embodiment of the present invention.

As shown in FIG. 7, each of the inlets 20 communicates with the supply tube 9 at its top and communicates with the liquid storing portion 21 at its bottom. The discharge portion 23 includes a slit 24.

Each of the small passages 22 communicates with the liquid storing portion 21 at its top and communicates with the slit 24 at its bottom. A communicating portion 25 between each small passage 22 and slit 24 is bent at a predetermined angle α. It is desirable that this angle ranges from 15° to 45°. The communicating portion 25 can be curved.

The slit 24 is tapered and vertically goes down from the communicating portion 25 to a discharge opening 26. Both the liquid storing portion 21 and the tapered slit 24 extend in the longitudinal direction of the nozzle 8 from the vicinity of one end of the nozzle to that of the other end thereof, and have substantially the same length. In this case, the temperature of the nozzle 8 can be controlled by forming a passage (not shown) to supply a heat-exchange medium such as water from a temperature controlling means (not shown) to the constituent of the nozzle 8.

A method for fabricating the nozzle 8 will be described with reference to FIG. 7.

The nozzle 8 is a combination of two members 8a and 8b which are made of fluororesin or hard PVC. The members 8a and 8b are secondary moldings obtained by cutting or grinding a primary molding, which is molded by the injection molding technique or the like, so as to have a desired shape. More specifically, fused resin is injected into a mold having a core to form a primary molding having the liquid storing portion 21. A drill is inserted into a suitable position on the top of the primary molding to form a pair of inlets 20 communicating with the liquid storing portion 21. A predetermined lower portion of surface 27 of the primary molding is ground, and the ground portion is part of the slit 24. Further, angular grooves communicating with the liquid storing portion 21 are ground at predetermined intervals.

Adhesive is applied to the surface 27 of the secondary molding member 8a so formed, and the member 8b is stuck on the member 8a, thereby completing the nozzle 8.

The size of each section of the nozzle 8 is as follows.

The diameter of the inlet 20 ranges from 4 to 10 mm and the length thereof ranges from 5 to 15 mm. The diameter of the liquid storing portion 21 ranges from 10 to 30 mm and the length thereof ranges from 120 to 250 mm. The transverse width of each of the small passages 22 ranges from 0.5 to 2 mm, the longitudinal width thereof ranges 0.1 to 0.5 mm, and the length thereof ranges from 3 to 10 mm. The thin tubes 22 are arranged at intervals of 0.3 to 2 mm. It is the most desirable that the longitudinal width of each small passage 22 is 0.3 mm. In this embodiment, eighty small passages 22 are formed.

It is desirable that the angle α of the bent communicating portion 25 ranges from 15° to 45°, and it is the most desirable that the angle is 30°. Although the bent communicating portion 25 is not always needed, it increases the fluid resistance of the small passages 22 and decreases the conductance. Further, the communicating portion 25 is very useful in forming a liquid film of liquids sequentially supplied like a curtain from the discharge opening 26. It is therefore desirable that the bent communicating portion 25 is formed between the small passages 22 and the slit 24.

Figure 8:
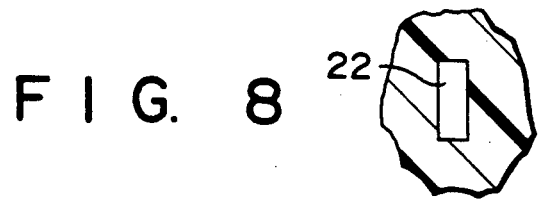
FIG. 8 is a transverse sectional view showing a small passage of the nozzle according to the embodiment of the present invention.
Figure 9:
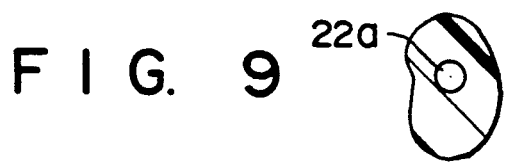
FIGS. 9 and 10 are transverse sectional views showing modifications of the small passage of the nozzle.
Figure 10:
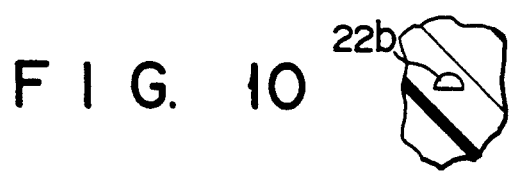

In the above embodiment, the small passages 22 are arranged in only one row, as illustrated in FIGS. 5 and 6 but they can be arranged in two rows. Though the transverse section of each of the small passages 22 is rectangular as shown in FIG. 8, a small passage 22a (FIG. 9) having a circular section or a small passage 22b having a semi-circular section (FIG. 10) can be used. Further, two inlets 20 as illustrated in FIGS. 5 and 6 are provided in the embodiment, however, three or more inlets can be provided.

The slit 24 as illustrated in FIG. 7 has a width of 0.5 mm at its upper portion, a width of 0.3 mm at its lower portion (a width of discharge opening 26), and a length of 120 to 250 mm.

The development of the semiconductor wafer W in the developing unit 108 will be described, referring to the flowchart shown in FIG. 11.

(I) A predetermined recipe for processing 6-inch wafers is input to a memory of the computer system 17 illustrated in FIG. 2, After the wafer W undergoes a photoresist coating process and an exposure process, it is carried to the developing unit 108 by the robot 110 and placed on the disk 2a of the spin chuck 2 using the handling mechanism 112 (see FIGS. 1 and 2). The wafer W is then fixed onto the disk 2a by vacuum attraction.

Figure 11:
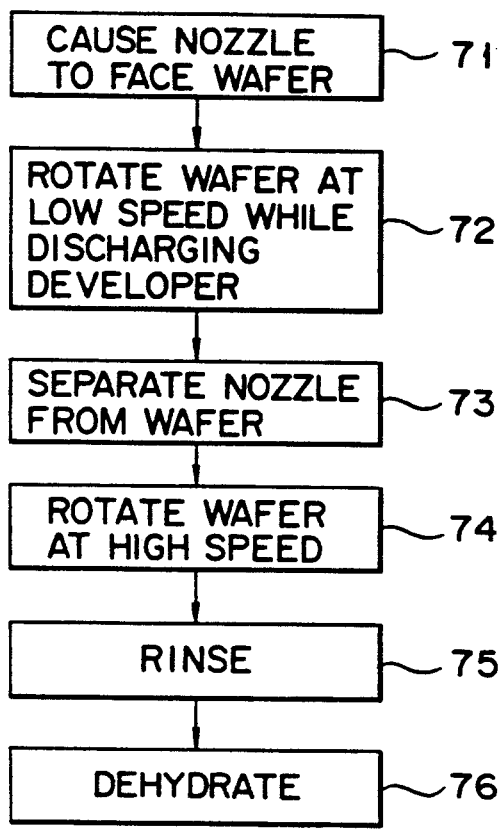
FIG. 11 is a flowchart showing a developing process.

The nozzle 8 in the home position is lowered and moved horizontally, as shown in FIG. 3 and 4 to face the wafer W (step 71 in FIG. 11). The standby position of the nozzle 8 is so determined that the middle of the nozzle 8 is located directly above the center of the wafer W and an interval between the discharge opening 26 and the upper surface of the wafer W is 1 mm (see FIGS. 2 and 4).

(II) Referring to FIG. 2, the first valve 10 is opened to supply a developer to the nozzle 8. The pressure at which the developer is supplied is 0.2 to 0.3 kg/cm$^2$ at the valve 10. The developer is controlled to have a temperature of about 23° C. by the temperature controlling means. As illustrated in FIGS. 5–7, the developer is collected in the liquid storing portion 21 through the inlets 20 and dispersed into the small passages 22. The developers of the small passages 22 are supplied to the slit 24 and flow together therethrough, and sequentially discharged from the discharge opening 26 like a curtain.

The conductance C of the nozzle 8 will be described. Generally, the conductance is almost proportionate to the fourth power of the diameter of the nozzle and inversely proportionate to the length thereof. If each of the small passages 22 uniformly has a diameter of 0.87 mm, the conductance of the liquid storing portion 21 is 439 times as high as that of the small passages 22. The liquid storing portion 21 has a diameter of 4 mm and a length of 160 mm, and the small passages 22 each have a transverse width of 2 mm, a longitudinal width of 0.3 mm, and a length of 10 mm. The number of the small passages is eighty.

(III) Referring to FIG. 2, the spin chuck 2 is rotated about 180°, at 30 rpm at substantially the same time when the developer is discharged from the nozzle 8 to the wafer W (step 72) of FIG. 11. The developer is uniformly applied to the entire surface of the wafer W. The nozzle 8 can be moved horizontally in the direction of X-axis from one end of the wafer W to the other end thereof while facing the wafer W in the stationary state as illustrated in FIGS. 3 and 4.

(IV) The nozzle 8 is then separated from the wafer W (step 73) of FIG. 11.

(V) The spin chuck 2 of FIG. 2 is rotated at high speed (300 rpm) after a lapse of 60 seconds after the developer is applied to the wafer W (step 74) of FIG. 11. The developer on the wafer W is thus separated from the nozzle 8.

(VI) The nozzle 8 (FIG. 2) is caused to face the wafer W again. The first valve 10 shown in FIG. 2 is then closed and the second valve 11 also shown in FIG. 2 is opened to supply demineralized water to the nozzle 8. The demineralized water is applied, like a curtain, to the rotating wafer W for ten seconds to rinse the wafer W (step 75) of FIG. 11.

(VII) The second valve 11 shown in FIG. 2 is then closed and the third valve 12 also shown in FIG. 2 is opened to supply nitrogen gas to the nozzle 8. The nitrogen gas is sprayed on the rotating wafer W to dehydrate the wafer W (step 76) of FIG. 11. After the dehydration, the wafer W is taken out of the unit 108 (FIG. 1) by the robot 110 and then transferred to the next step.

Referring to FIGS. 5–7, the nozzle 8 of the above embodiment, since the conductance of the liquid storing portion 21 is 439 times as high as that of the small passages 22, the liquid storing portion 21 is nearly sealed, and the developer can uniformly be scattered on the small passages 22. The developer is continuously discharged like a curtain from the discharge opening 26. Since the discharge of the developer is very satisfactory, the resist film on the wafer W can be uniformly developed.

If the conductance of the liquid storing portion 21 hundred fold or more times as high as that of the small passages 22, the developer is supplied from the liquid storing portion 21 to all the small passages 22 at substantially the same pressure.

Since a fluid resistance occurs at the bent communicating portion 25, the developers from the small passages 22 flow together through the slit 24 to continuously discharge them like a curtain.

Since the slit 24 is tapered, it is possible to improve in uniformly discharging the developer.

Figure 12:
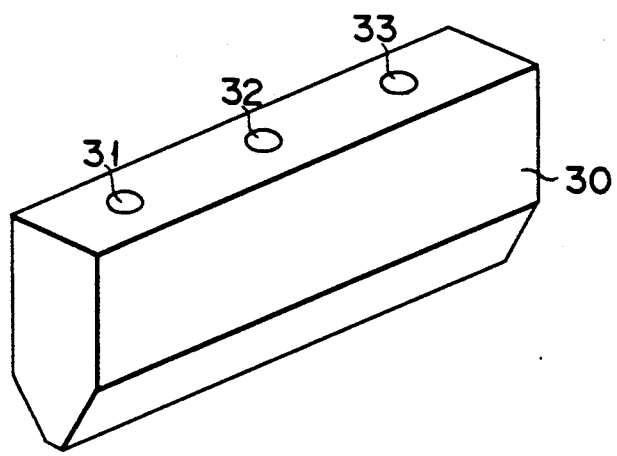
FIG. 12 is a perspective view showing a nozzle according to another embodiment of the present invention.

The nozzle can be replaced with a nozzle 30 as shown in FIG. 12. The nozzle 30 is provided with a developer supply port 31, a demineralized water supply port 32, and a nitrogen gas supply port 33. These ports 31, 32, and 33 are connected to their sources 13, 14, and 15 which are illustrated in FIG. 2. The nozzle 30 can be so constructed that the liquid or gas can be switched. In this nozzle 30, however, a supply tube (not shown) connected to the nozzle is required, and the liquid or gas remaining in the supply tube is not mixed into the nozzle in the preprocess.

In the above embodiment, the nozzle is used in the developing unit. However, it can be used in the other units such as a resist coating unit, a cleaning unit for cleaning a wafer or an LCD, and a unit for applying a magnetic liquid.

In the above embodiment, the semiconductor wafer is used as an object to be processed. The semiconductor wafer can be replaced with an LCD substrate, a printed circuit board, a magnetic recording medium or the like.

Additional advantages and modifications will readily occur to those skilled in the art. Therefore, the invention in its broader aspects is not limited to the specific details, representative devices, and illustrated examples shown and described herein. Accordingly, various modifications may be possible without departing from the spirit or scope of the general inventive concept as defined by the appended claims and their equivalents.

What is claimed is:

1. A system for applying a liquid to an object to be processed, comprising:
   a liquid supply source; and
   nozzle means communicating with said liquid supply source;
   said nozzle means including:
      a liquid storing portion for storing a liquid supplied from said liquid supply source;
      a plurality of small passages communicating with said liquid storing portion, each of said small passages having a transverse section which is smaller than that of said liquid storing portion; and
      a slit passage communicating with said small passages, in which liquids flowing from said small passages are mixed together and discharged from said slit passage toward said object to be processed.

2. The system according to claim 1, wherein said small passages are arranged in a row at intervals.

3. The system according to claim 1, wherein said small passages each have a rectangular transverse section.

4. The system according to claim 1, wherein said small passages each have a circular transverse section.

5. The system according to claim 1, wherein said small passages each has a semi-circular transverse section.

6. The system according to claim 1, wherein a pressure resistance of said liquid storing portion is 100 or more times as high as that of said small passage.

7. The system according to claim 1, wherein said small passage is inclined at an angle to said slit passage, and a bent communicating portion is connected between said small passage and said slit passage.

8. The system according to claim 7, wherein said small passage is inclined at an angle of 15 to 45 degrees to said slit passage.

9. The system according to claim 1, wherein said slit passage is tapered toward its liquid discharging side.

10. The system according to claim 1, wherein said slit passage is straight formed.

11. The system according to claim 1, wherein said liquid storing portion extends along said slit passage, and a length of said liquid storing portion in its longitudinal direction is substantially the same as that of said slit-like passage in its longitudinal direction.

12. A method for applying a liquid to an object to be processed, comprising the steps of:
   (a) preparing the object to be processed;
   (b) preparing nozzle means, said nozzle means including:
      a liquid storing portion communicating with a liquid supply source, for storing a liquid supplied from a liquid supply source;
      a plurality of small passages communicating with said liquid storing portion, each of said small passages having a transverse section which is smaller than that of said liquid storing portion; and
      a slit passage communicating with said small passages, in which liquids flowing from said small passages are mixed together and discharged from said slit passage toward said object to be processed;
   (c) causing an opening of the slit passage of said nozzle means to face said object to be processed;
   (d) discharging the liquids from said nozzle means to said object to be processed while moving at least one of said nozzle means and said object to be processed; and
   (e) separating said nozzle means from said object to be processed.

13. The method according to claim 12, wherein said discharging step comprises a step of rotating said object to be processed, with said nozzle means in a stationary state.

14. The method according to claim 12, wherein said discharging step comprises a step of moving said nozzle means from one end of said object to be processed to other end thereof, with said object to be processed remaining in a stationary state.

* * * * *